United States Patent [19]
Karl et al.

[11] Patent Number: 6,133,858
[45] Date of Patent: Oct. 17, 2000

[54] BUS SYSTEM, A PERIPHERAL DEVICE AND A METHOD FOR DECODING A DIGITAL SIGNAL

[75] Inventors: Otto Karl, Leonberg-Hoefingen; Joachim Bauer, Oberstenfeld-Prevorst; Guenther Ott, Nürnberg; Dietmar Koehler, Wolfschlugen, all of Germany

[73] Assignee: Robert Bosch GmbH, Stuttgart, Germany

[21] Appl. No.: 08/955,060

[22] Filed: Oct. 21, 1997

[30] Foreign Application Priority Data

Oct. 21, 1996 [DE] Germany ............................ 196 43 410

[51] Int. Cl.$^7$ ..................................................... H03M 5/08
[52] U.S. Cl. ............................... 341/53; 341/50; 341/157; 341/152
[58] Field of Search ................................. 341/50, 53, 157, 341/152

[56] References Cited

U.S. PATENT DOCUMENTS

| | | |
|---|---|---|
| 5,140,256 | 8/1992 | Hara ........................................ 324/77 R |
| 5,315,299 | 5/1994 | Matsumoto . |
| 5,588,023 | 12/1996 | Ho ............................................ 375/238 |
| 5,637,798 | 6/1997 | Schatz .................... 73/514.32 |
| 5,774,084 | 6/1998 | Brombaugh et al. .................... 341/152 |

FOREIGN PATENT DOCUMENTS 196 16 293  10/1997  Germany .

*Primary Examiner*—Michael Tokar
*Assistant Examiner*—Anh Q. Tran
*Attorney, Agent, or Firm*—Kenyon & Kenyon

[57] ABSTRACT

A method for decoding pulse-width modulated signals, such that a sawtooth signal is generated. The sawtooth signal is synchronized with a signal to be decoded. By comparing the sawtooth signal with a reference, a temporal center of a time period reserved for transmission of a bit can be measured, thus reducing a demodulation of the signal to a measurement of the signal level. Furthermore, a data bus for an activation system utilizing this method is also provided.

33 Claims, 4 Drawing Sheets

BUS SYSTEM, A PERIPHERAL DEVICE AND A METHOD FOR DECODING A DIGITAL SIGNAL

FIELD OF THE INVENTION

The present invention relates to a method for decoding a digital signal, and to a bus system and a peripheral device for decoding a digital signal.

BACKGROUND INFORMATION

A conventional method for decoding a digital signal is described. The digital signal is a pulse-width modulated signal. The signal can assume two states, a high signal level and low signal level. In pulse-width modulation, a specific time, i.e., the total pulse width, is provided for each bit to be transmitted. During the total pulse width, the signal assumes first the low and then the high signal level. The duration of the high signal level includes either one-third or two-thirds of the total pulse width. The first case corresponds to a coded binary zero, the second case to a 1. Decoding of this bit is accomplished by measuring the signal level at approximately half the total pulse width. The decoder is equipped with an oscillator to measure reliably the middle of the total pulse width.

The need to equip the decoder with the oscillator makes the decoder more expensive. If longer bit streams are to be decoded, on the one hand, the oscillator in the decoder must be accurate. On the other hand, the total pulse widths of the individual bits must also be highly reproducible. Such requirement makes necessary the use of highly accurate and exactly tuned oscillators in both the decoder and the coder.

Unpublished German Patent Application No. 1 96 162 93.9 describes a bus system for a transmission of messages between a control device and a peripheral unit, such that the control device sends high-priority messages and low-priority messages to the peripheral unit. High-priority messages have a greater amplitude than low-priority messages. The messages consist of digital signals—a binary 0 corresponds to a low signal level, and a binary 1 to a high signal level.

SUMMARY OF THE INVENTION

A method according to the present invention includes no oscillator in a decoder when the method is used to decode the digital signal. A bus system, a peripheral unit, and a device according to the present invention are simpler and consequently less expensive to construct than a conventional system, unit, and device.

For example, it is advantageous to measure the signal level of the signal several times, since the signal to noise ratio is thereby improved. It is particularly advantageous to measure the signal three times for each bit and to convey the results to a majority decider, because the signal analysis becomes particularly simple.

The time between the individual measurements for the same bit can be measured in particularly simple and economical fashion using an RC oscillator.

It is also advantageous to transmit high-priority and low-priority messages in the bus system (the high-priority messages having a higher amplitude than the low-priority messages), since the higher-priority messages automatically overwrite the lower-priority messages. Further, it is advantageous to keep the total pulse width of the higher-priority messages narrower, since a higher transmission rate for the high-priority messages is achieved. At the same time, narrower total pulse widths ensure better electromagnetic compatibility for the low-priority messages.

It is further advantageous to provide a bus system according to the present invention that is configured as an activation bus for an airbag system (the low-priority messages representing diagnostic queries and the higher-priority messages representing activation commands), since an airbag system has a flexible design and can be easily expanded and/or repaired.

DETAILED DESCRIPTION

Figure 1:
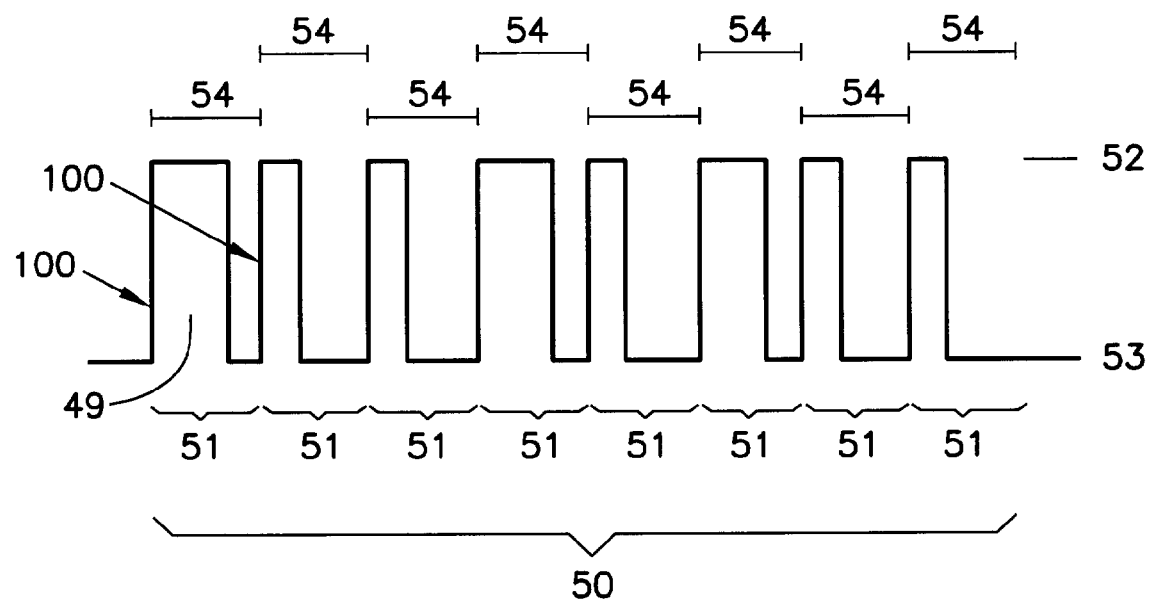
FIG. 1 shows a digital signal with pulse-width modulated bits.

FIG. 1 shows a digital signal 50 with pulse-width modulated bits, which includes a start bit 49 and a binary number 0010100, as will be explained below. The digital signal 50 can alternate between two signal levels: a high signal level 52 and a low signal level 53. The difference between the two signal levels is great enough that disrupting effects such as noise, drift, or small deviations from an ideal signal level can be ignored. Such effects are not shown in FIG. 1. The signal 50 is a sequence of eight bits 51; the first bit 49, i.e., the start bit, is not intended to be decoded. The duration of all the bits is identical, and includes a total pulse width 54.

When no data is being transmitted, the signal 50 assumes the low signal level 53. A bit begins with a steep rise 100 to the high signal level 52, which in the first bit is kept unchanged, for example, for two-thirds of the total pulse width. There follows the steep fall to the low signal level 53, which then remains unchanged for the remainder of the total pulse width. The second bit, shown in FIG. 1 begins, for example, with the steep rise 100 to the high signal level 52, which is kept unchanged for one-third of the total pulse width, followed by the steep fall to the low signal level 53, which is kept unchanged for two-thirds of the total pulse width.

The duration of the low signal level in the bit 51 determines the value of the bit 51. If the signal level is predominantly low, the bit has the value 0, otherwise, the bit has the value 1. The signal 50 includes, in addition to the start bit 49 which has the value 1, the bit sequence 0010100.

Figure 2:
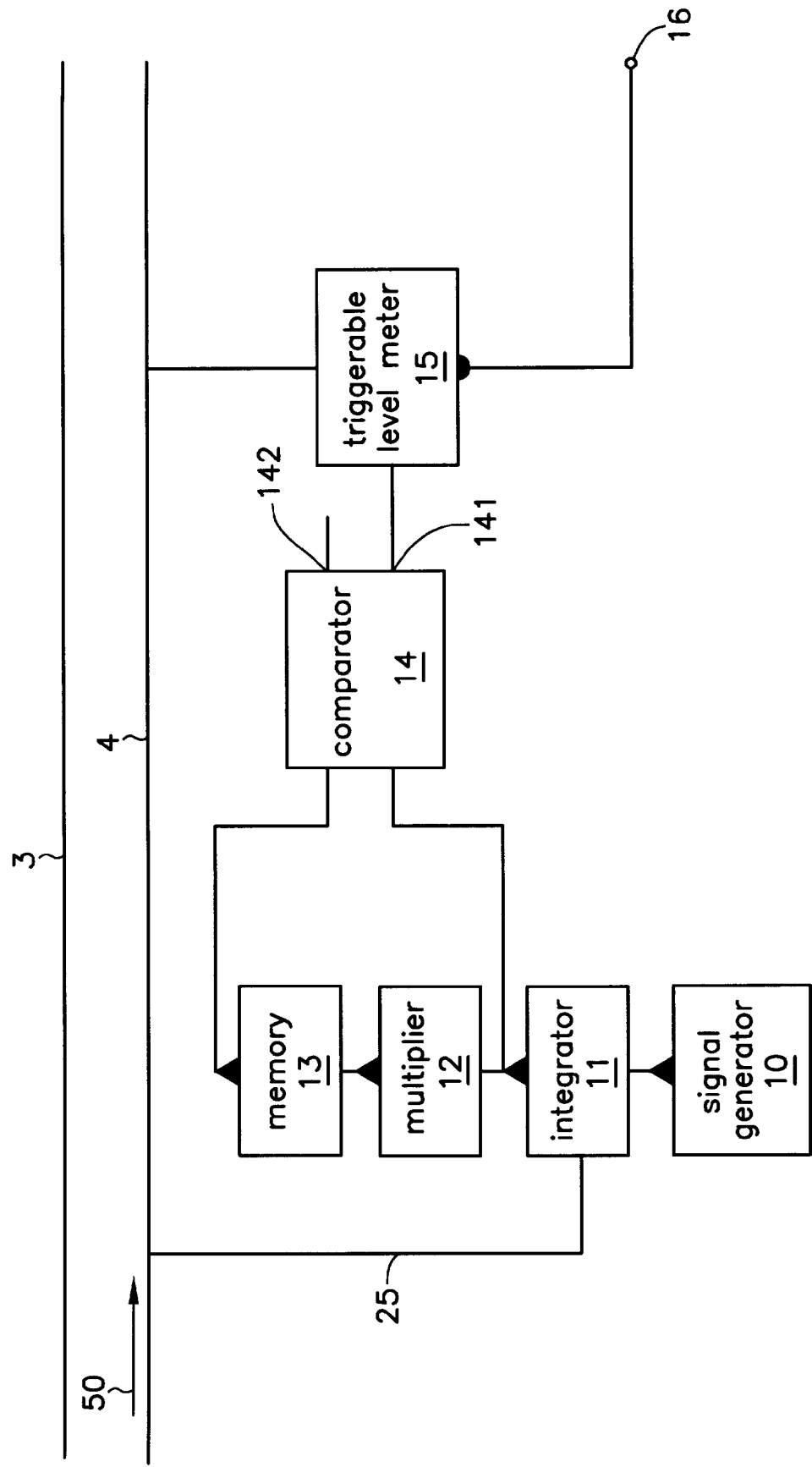
FIG. 2 shows a first circuit for decoding the digital signal with the pulse-width modulated bits according to the present invention.

FIG. 2 shows a block diagram of a device according to the present invention which is used to decode a pulse-width modulated (PWM) signal. Bus lines 3 and 4 are the lines which are used to propagate the signal 50. The bus line 3 is a ground line, and the bus line 4 is a signal line. The signal line 4 is connected via a trigger line 25 to an integrator 11. The input of the integrator 11 is connected to the output of a second signal generator 10. The second signal generator 10 for a second signal 56 is configured as a DC voltage source or a DC voltage connection. The output of the integrator 11 is connected at one end to a multiplier 12, and, on the other to a first input of a comparator 14. The output of the multiplier 12 is connected to a memory 13 which is connected to a second input of comparator 14.

Figure 3:
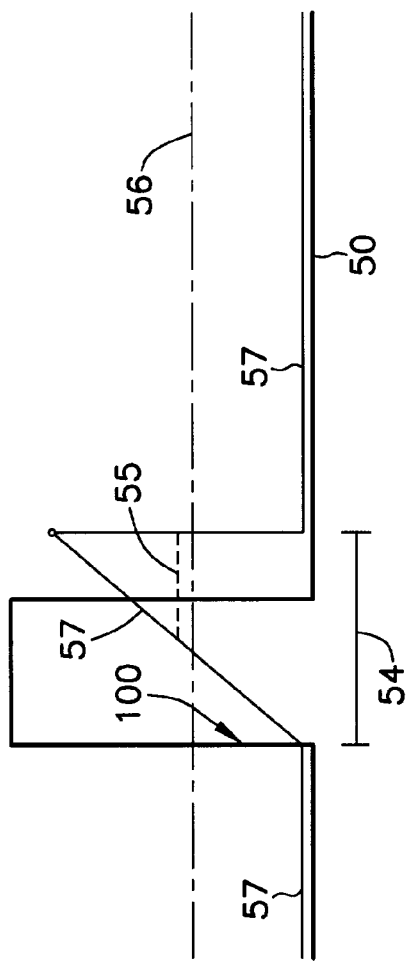
FIG. 3 shows a pulse-width modulated bit and a second signal with integration over the second signal.

FIG. 3 shows one bit of the PWM-encoded signal 50 which extends over the total pulse width 54. The second signal 56 is constant over time. FIG. 3 also shows an integrated second signal 57, the steep rise 100 having been selected as the lower integration limit, and the total pulse width as the integration interval. Plotted is the peak value times 0.5 of the integrated second signal 57, which is called a reference 55.

In addition to the signal 50, which is to be decoded, the second signal 56 is made available by the signal generator 10. The integration of the second signal 56 yields a rising signal with a constant slope. The integrator 11 which performs the integration of the second signal 56 is configured so that it is triggerable. The trigger signal is given by the steep rise 100 of the PWM bit. Each trigger signal sets the output of the integrator 11 to zero, and causes integration to begin again. The signal present at the output of the integrator 11 consists of a sequence of triangular signals, the width of one triangle corresponding to one total pulse width 54. The maximum value of the first triangle is conveyed to the multiplier 12, which is multiplied by a defined number. In the exemplifying embodiment of the present invention, such number is 0.5. The result of the multiplication is stored in the memory 13 as a reference 55. In the course of the next bit 51 of the signal 50, the output signal of the integrator 11 is continuously compared with the reference 55 which is stored in the memory 13. The comparator 14, to which the value present in the memory 13 and the output of the integrator 11 are applied, is provided for this purpose. When the integrated second signal 57 reaches the reference 55, a certain signal, for example a "1", by which measurement of the level of the signal 50 is controlled, is present at the regular output 141 of comparator 14. A triggerable level meter 15 is included.

It is assumed in this exemplary embodiment of the present invention that writing to the memory is timed, or is triggered by the steep rise 100. The total pulse width 54 is thus, as it were, remeasured for each bit, and the method becomes less sensitive to drift phenomena.

Alternatively, the memory can also be configured so that its contents can be overwritten only by a larger number. This feature prevents the reference from being erased at the beginning of each bit. This feature can be effected in simple fashion with an additional comparator (not depicted in the drawings) which compares the memory contents with the input. A further possibility which results is to block overwriting of the memory 13 when a signal is present at the comparator 14. Instead of the multiplier 12, it is possible to provide a filter which smooths the integrated signal, thus creating the reference.

Figure 4:
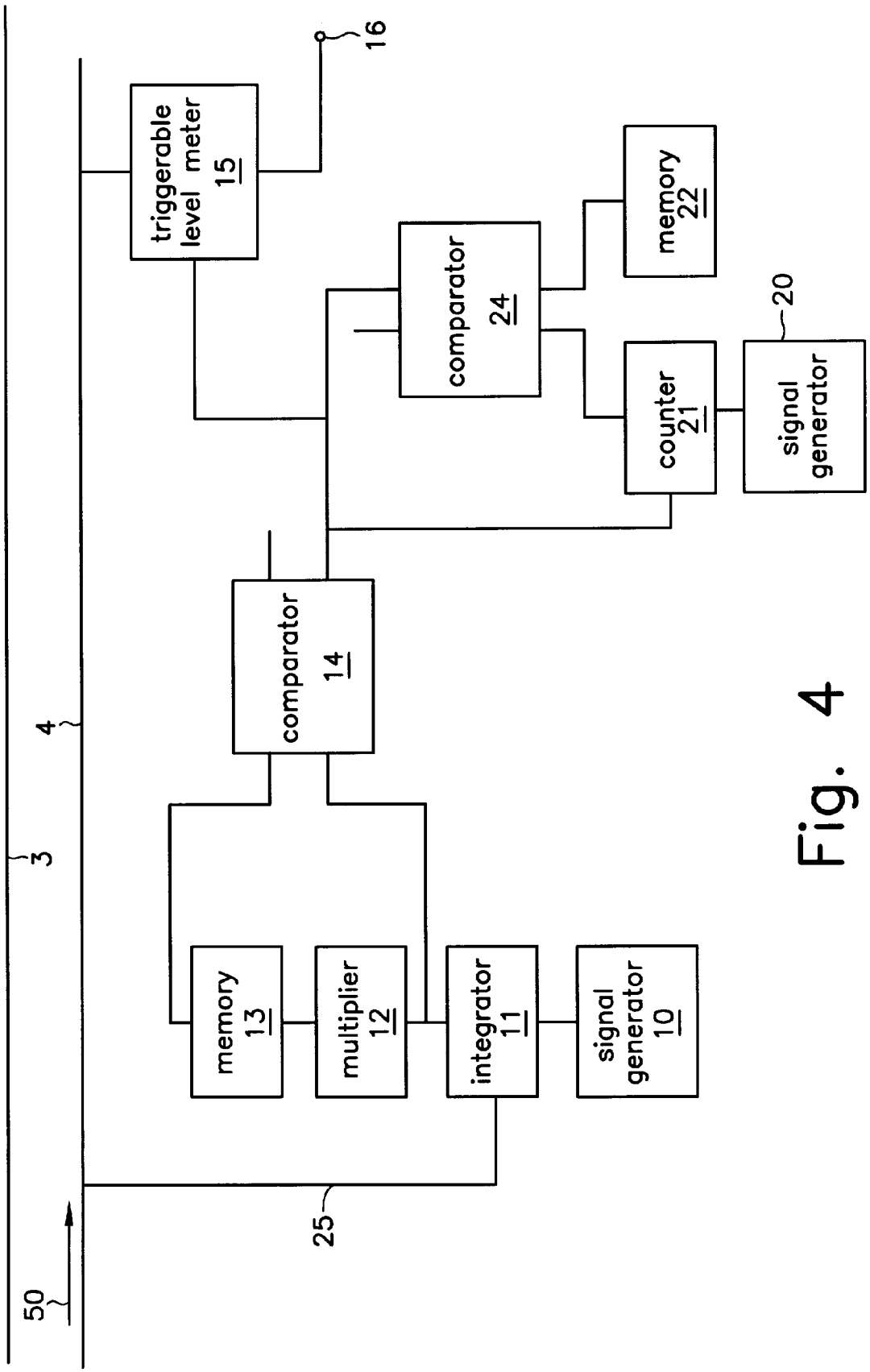
FIG. 4 shows a second decoder for decoding the digital signal with the pulsewidth modulated bits according to the present invention.

The exemplary embodiment of FIG. 2 can be varied, because the level of signal 50 is measured, not only once in the middle of the total pulse width, but three times in the middle third of the total pulse width. A circuit according to the present invention which implements the developed method is shown in FIG. 4. The digital signal 50 to be decoded is made available via the bus lines 3 and 4. The bus line 3 is the ground line, and the signal is applied to the bus line 4. The bus line 4 is connected via the trigger line 25 to the fourth signal generator 26, which is configured as a triggerable sawtooth generator. The multiplier 12 is connected to the output of the triggerable sawtooth generator. In addition, the comparator 14 is connected to the memory of the fourth signal generator 26. The second input of the comparator 14 is connected to the memory 13. The output of the comparator 14 is connected, on the one hand, to the triggerable level meter 15, which is connected to the bus line 4. On the other hand, the comparator 14 is connected to the trigger input of the counter 21. The circuit also includes a third signal generator 20, the output of which is connected to the input of the counter 21. The circuit has a second memory 22. The memory 22 and the output of the counter 21 are connected to the inputs of the second comparator 24. The output of the comparator 24 is connected, along with the output of the comparator 14, to the triggerable level meter 15.

The fourth signal generator 26 generates a fourth signal which is configured as a sawtooth signal synchronized with the signal 50 to be decoded. The fourth signal generator 26 corresponds to that extent to the combination of the second signal generator 10 and the integrator 11. The reference 55 is calculated in the multiplier 12, from the maximum value of the fourth signal which the latter assumes during the first bit, and stored in the memory 13.

For all subsequent bits of the signal 50, the second signal is compared with the reference 55 using the comparator 14. When the fourth signal has reached the reference 55, the comparator 14 triggers the triggerable level meter 15, causing the signal level of the signal 50 to be measured.

Simultaneously, the comparator 14 also triggers the counter 21 which begins a counting operation upon receiving a trigger signal. The output signal of the third signal generator 20 is applied to the input of the counter 21. The third signal generator 20 generates a rapidly oscillating periodic signal. The third signal generator 20 can include, for example, an RC oscillator. The oscillations of the third signal are counted in the counter 21, specifically from the point in time at which the comparator 14 triggered the measurement of the signal level of the signal 50. The comparator 24 compares the number of the oscillations of the third signal since the level measurement with a defined number which is stored in the memory 22. When the number of oscillations reaches the defined number, the second comparator 24 triggers the triggerable level meter 15 and causes the level of signal 50 to be measured again. The frequency of the third signal, and the defined number in the memory 22, are to be selected and tuned to one another in such a way that the second measurement of the signal level of the signal 50 also still occurs in the region in which the pulse-width modulated 0 and the pulse-width modulated 1 differ in terms of signal level. In the present example, this is the middle third of the total pulse width 54.

The method shown in FIG. 4 can, for example, be expanded by measuring the signal level of the signal 50 more than twice. The apparent choice is to measure the signal level three times, since the three readings can be buffered and, after completion of the third measurement, can be conveyed to a majority decider. Measurement errors caused, for example, by crosstalk from other lines can thereby be eliminated with very simple means.

The method is based on the principle of utilizing a first bit to measure the total pulse width and, with the aid of this information, decoding a further bit by calculating, from the measured total pulse width, a point in time for measurement of the signal level.

For example, the present invention determines the total pulse width, using an oscillator that has a period that is much shorter than the total pulse width, as a multiple of the period of the oscillator. The present invention further calculates the reference, for example by simple multiplication, and stores it. To decode the bits, the number of periods of the oscillator since the last steep rise in the signal to be decoded is then compared with the reference, and the signal level of the signal to be decoded is then determined as applicable.

Figure 5:
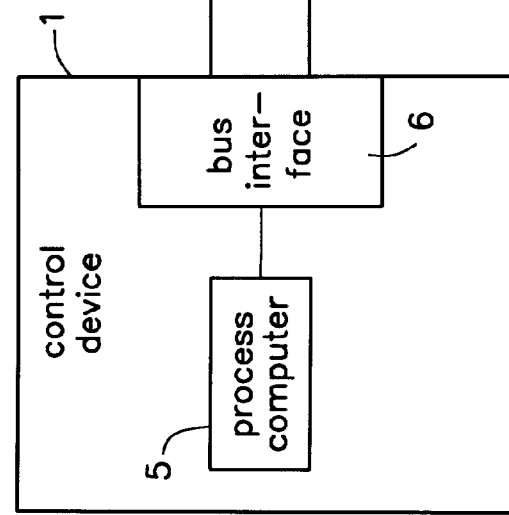
FIG. 5 shows a bus system according to the present invention.

FIG. 5 shows a control device 1 connected via the bus lines 3 and 4 to multiple peripheral units 2. The control device 1 has a process computer 5 and a bus interface 6. The bus lines 3 and 4 are connected to the bus interface 6. The bus lines 3 and 4 create a two-wire bus through which the messages can be exchanged between the control device 1 and the peripheral units 2. Since only the two lines are necessary for the bus of this kind, the complexity of the wiring between the control device 1 and the peripheral units 2 can be kept particularly low. The messages are exchanged via the bus because the respective sending station places electrical signals, both current signals and voltage signals, onto the bus lines 3 and 4, which are then analyzed by the receiving station. According to the present invention, the line 3 is the ground line and the signal is applied to the line 4. The messages consist of a sequence of bits, each bit being pulse-width modulated. One such sequence of bits has already been depicted in FIG. 1.

For a first application, the amplitude of the voltage signal, i.e., the difference between the low and the high signal levels, is selected to be low. In addition, the total pulse width 54 is assumed to be relatively wide. An advantage of such of transmission of the messages is that the electromagnetic interference caused by the bus is particularly low. Because of the low transmission rate, such transmission of messages is particularly suitable when the time priority of the messages is not high.

It is possible to transmit on the bus 4 a signal with pulse-width modulated bits which has a very high amplitude and a very narrow total pulse width. The transmission of this signal causes stronger electromagnetic interference, but because of the narrow total pulse width 54, a much higher transmission rate can be achieved. Because of the difference in amplitude, high-amplitude messages can be overwritten at any time by the low-amplitude messages.

The system shown in FIG. 5, which includes the control device 1, the peripheral units 2, and the bus lines 3 and 4, is intended, for example, as an airbag system. The airbag system has the central control device 1 and the peripheral units 2 which have respectively an airbag, a side airbag, a belt tensioner, or other elements. The commands to activate the individual peripheral units 2 must be transmitted with high priority, with no tolerance for any delay. In addition, a system of this kind should be capable of constantly checking the functionality of the individual peripheral units 2. The control device 1 can send diagnostic requests to the peripheral units 2, which can then, using a return signal, confirm their ability to function. The diagnostic requests are of low priority by comparison with the commands for activating the peripheral units 2.

The bus system according to the present invention can advantageously be used for the airbag system, in which continuous diagnostic information regarding the operational readiness of the individual peripheral units 2 is exchanged between the control device 1 and the pertinent peripheral units 2, and commands from the control device 1 to the peripheral units 2, leading to the activation of the functions of the individual peripheral units 2, must then be transmitted with high priority.

What is claimed is:

1. A method for decoding a digital signal having pulse-width modulated bits, the digital signal having a high signal level and a low signal level, the method comprising the steps of:

(a) declining to decode a first bit of the pulse-width modulated bits, the first bit including a predetermined total pulse-width identical for each bit of the pulse-width modulated bits, the first bit being used to determine the predetermined total pulse-width;

(b) calculating a measurement time as a function of the predetermined total pulse-width; and (c) measuring a corresponding signal level of the digital signal for a second bit of the pulse-width modulated bits when the measurement time has elapsed.

2. The method according to claim 1, wherein the measurement time is calculated by multiplying the predetermined total pulse-width by a predetermined factor.

3. The method according to claim 1, further comprising the steps of:

(d) generating a sawtooth signal having a predetermined value at a rising edge of each bit of the pulse-width modulated bits, the sawtooth signal reaching a maximum value and then being reset at a falling edge of each bit of the pulse-width modulated bits;

(e) multiplying the maximum value of the sawtooth signal by a predetermined factor at least for the first bit of the digital signal to form a resulting value;

(f) storing the resulting value as a reference value;

(g) continuously comparing a current value of the sawtooth signal with the reference value for a bit of the pulse-width modulated bits to be decoded;

(h) measuring the signal level of the digital signal at least once when the sawtooth signal exceeds the reference value; and (i) repeating steps (g) and (h) for each bit to be decoded.

4. The method according to claim 3, wherein the predetermined factor is 0.5.

5. The method according to claim 1, wherein the corresponding signal level of the digital signal is measured three times for each bit of the pulse-width modulated bits.

6. The method according to claim 3, further comprising the steps of:

(j) generating a periodic signal;

(k) calculating a number of periods of the periodic signal to form a first count value;

(l) restarting the first count value when the current value of the sawtooth signal exceeds the reference value; and (m) further measuring the corresponding signal level of the digital signal when the first count value reaches a first defined value.

7. The method according to claim 6, wherein the periodic signal is generated using an RC oscillator.

8. The method according to claim 6, further comprising the step of:

(n) forming a second count value corresponding to the number of periods of the periodic signal, wherein the first count value is different from the second count value, wherein the corresponding signal level of the digital signal is measured when the first count value is reached, and wherein the corresponding signal level is measured when the second count value is reached.

9. The method according to claim 5, further comprising the steps of:

(d) storing the corresponding signal level of the digital signal;

(e) comparing signal levels of the digital signal; and (f) processing a most frequently measured signal level as dominant for decoding the bit.

10. The method according to claim 3, wherein step (d) includes the substeps of:
  (i) generating a further signal that is constant over time,
  (ii) integrating the further signal over the predetermined total pulse-width of the first bit of the digital signal, an integration being restarted at the rising edge of each bit of the pulse-width modulated bits to form a further value, and
  (iii) setting the resulting value to zero.

11. The method according to claim 10, wherein the digital signal is at least one of rectified and smoothed when the further signal is generated.

12. A bus system for transmitting messages between a device and at least one peripheral device, the system comprising:
  a control device providing the messages as a digital signal having a sequence of pulse-width modulated bits, each bit of the pulse-width modulated bits having a high signal level and a low signal level; and
  a peripheral device decoding the pulse-width modulated bits by performing the following steps:
    (a) declining to decode a first bit of the pulse-width modulated bits, the first bit including a predetermined total pulse-width identical for each bit of the pulse-width modulated bits, the first bit being used to determine the predetermined total pulse-width,
    (b) calculating a measurement time as a function of the predetermined total pulse-width, and
    (c) measuring a corresponding signal level of the digital signal for a second bit of the pulse-width modulated bits when the measurement time has elapsed.

13. The bus system according to claim 12, wherein the control device transmits the messages to the peripheral device, the messages including high-priority messages and low-priority messages, the high-priority messages having a greater difference between the high signal level and the low signal level than the low-priority messages.

14. The bus system according to claim 12, wherein the predetermined total pulse width of a first individual bit of the high-priority messages is narrower than the predetermined total pulse width of a second individual bit of the low-priority messages.

15. The bus system according to claim 12, wherein the peripheral device is configured to activate an airbag, wherein the low-priority messages are configured as diagnostic requests to determine an operational readiness of the airbag, and wherein the high-priority messages are configured as activation commands for the airbag.

16. The bus system according to claim 15, further comprising:
  a plurality of further peripheral devices coupled to bus lines, the diagnostic request including an address of one of the peripheral devices, one of the peripheral devices having the address transmits a reply signal to the control device, the control device recognizing whether the peripheral device is operationally ready.

17. The bus system according to claim 16, wherein the reply signal includes a load provided on the bus lines.

18. A peripheral unit for a bus system for receiving a digital signal, the peripheral unit comprising:
  a receiver receiving the digital signal, the digital signal including a sequence of pulse-width modulated bits, each of the bits having a high signal level, a low signal level, and a predetermined total pulse width;
  a first signal generator generating a first signal;
  a first device multiplying the first signal by a predetermined factor to form a resulting value, the resulting value being stored as a reference value; and
  a first comparator comparing a first value of the first signal with the reference value, the first comparator controlling a measurement of a level of the digital signal.

19. The peripheral unit according to claim 18, wherein the first device includes at least one of a multiplier and a voltage divider, and wherein the predetermined factor is 0.5.

20. The peripheral unit according to claim 18, further comprising:
  a second signal generator generating a second periodic signal;
  a counter counting the periods of the second periodic signal to form a counter resulting value, the counter being actuated by the first comparator;
  a memory arrangement for storing at least one predetermined number; and
  a second comparator comparing the counter resulting value with the predetermined number, the second comparator controlling the measurement of the level of the digital signal.

21. The peripheral unit according to claim 20, wherein the second signal generator includes an RC oscillator.

22. The peripheral unit according to claim 18, further comprising:
  a circuit arrangement for recognizing the received digital signal exceeding a predetermined difference between the high signal level and the low signal level so that high amplitude signals and low amplitude signals can be separated.

23. The peripheral unit according to claim 22, wherein a processing of the low amplitude signals is terminated when the high amplitude signals are received.

24. The peripheral unit according to claim 22, wherein the low amplitude signals correspond to low-priority signals providing diagnostic requests, and further comprising:
  a transmitter arrangement for sending a reply signal.

25. The peripheral unit according to claim 24, wherein the reply signal corresponds to a load provided on two bus lines of the bus system.

26. The peripheral unit according to claim 18, wherein the bus system transmits power to the peripheral unit.

27. The peripheral unit according to claim 18, wherein the peripheral unit includes a peripheral address, and wherein the digital signal includes receivable messages each having a corresponding target address, and further comprising:
  a second device comparing the corresponding target address with the peripheral address of the peripheral unit.

28. The peripheral unit according to claim 18, wherein the peripheral unit includes an activation unit for at least one of an airbag and a belt tensioner system.

29. A device for transmitting messages to at least one peripheral unit, the device comprising:
  a controller providing the messages as digital signals including a sequence of pulse-width modulated bits, each of the bits of the pulse-width modulated bits having a total pulse width, the total pulse width having a high signal level and a low signal level, the messages including high-priority messages having a first difference value between the high signal level and the low signal level, the messages further including low-priority messages having a second difference value between the high signal level and the low signal level, the first difference value being greater than the second difference value; and
  a transmitter transmitting the messages.

30. The device according to claim 29, wherein the high-priority messages include first bits having a first pulse width, and wherein the low-priority messages include second bits having a second pulse width, the first pulse width being smaller that the second pulse width.

31. The device according to claim 29, wherein the high-priority messages are transmitted after at least one of the low-priority messages are sent and the messages are received by the at least one peripheral unit.

32. The device according to claim 29, wherein the low-priority messages are configured as diagnostic requests determining if the at least one peripheral unit is operationally ready, and wherein the high-priority messages are configured as activation commands for the at least one peripheral unit.

33. The device according to claim 29, further comprising:
an arrangement for receiving messages from the at least one peripheral unit.

* * * * *